US012663383B2

(12) United States Patent
Furukawa et al.

(10) Patent No.: US 12,663,383 B2
(45) Date of Patent: Jun. 23, 2026

(54) METHOD OF EVALUATING SILICON SINGLE-CRYSTAL INGOT, METHOD OF EVALUATING SILICON EPITAXIAL WAFER, METHOD OF MANUFACTURING SILICON EPITAXIAL WAFER, AND METHOD OF EVALUATING SILICON MIRROR POLISHED WAFER

(71) Applicant: SUMCO CORPORATION, Tokyo (JP)

(72) Inventors: Jun Furukawa, Yamagata (JP); Kazuya Suzuki, Yamagata (JP); Keiichiro Mori, Saga (JP); Takahiro Nagasawa, Saga (JP)

(73) Assignee: SUMCO CORPORATION, Tokyo (JP)

( * ) Notice: Subject to any disclaimer, the term of this patent is extended or adjusted under 35 U.S.C. 154(b) by 401 days.

(21) Appl. No.: 18/562,575

(22) PCT Filed: Jan. 20, 2022

(86) PCT No.: PCT/JP2022/001939
§ 371 (c)(1),
(2) Date: Nov. 20, 2023

(87) PCT Pub. No.: WO2022/244304
PCT Pub. Date: Nov. 24, 2022

(65) Prior Publication Data
US 2024/0230553 A1     Jul. 11, 2024

(30) Foreign Application Priority Data

May 21, 2021     (JP) ................................. 2021-085883

(51) Int. Cl.
G01N 21/95          (2006.01)
C30B 29/06          (2006.01)
(Continued)

(52) U.S. Cl.
CPC ......... G01N 21/9501 (2013.01); C30B 29/06 (2013.01); C30B 33/00 (2013.01);
(Continued)

(58) Field of Classification Search
CPC .... G01N 21/47; G01N 21/95; G01N 21/9501; G01N 21/9503; G01N 21/9505;
(Continued)

(56) References Cited

U.S. PATENT DOCUMENTS 5,298,963 A * 3/1994 Moriya .............. G01N 21/9501
                                                    356/600
6,362,487 B1   3/2002 Ehlert et al.
(Continued)

FOREIGN PATENT DOCUMENTS

CN          109690746 A       4/2019
CN          107086184 B       5/2020
(Continued)

OTHER PUBLICATIONS

International Preliminary Report on Patentability issued in WIPO Patent Application No. PCT/JP2022/001939, dated Nov. 21, 2023, along with an English translation thereof.
(Continued)

*Primary Examiner* — Gordon J Stock, Jr.
(74) *Attorney, Agent, or Firm* — Greenblum & Bernstein, P.L.C.

(57)          ABSTRACT

A method of evaluating a silicon single-crystal ingot, the method including cutting out three or more plural silicon wafers from the ingot to be evaluated; mirror polishing the plural silicon wafers to yield silicon mirror-surface wafers; processing the plural silicon mirror polished wafers into silicon epitaxial wafers through formation of an epitaxial layer on the mirror polished surfaces; acquiring light point defect maps of the epitaxial layer surfaces of the plural
(Continued)

silicon epitaxial wafers with a laser surface inspection device; and creating an overlay map. In a case where a light point defect group in which three or more light point defects are linearly distributed is not confirmed in the overlay map, a region, from which the plural silicon wafers have been cut out, in the silicon single-crystal ingot to be evaluated, is estimated not to be a region in which a twin has occurred.

15 Claims, 3 Drawing Sheets

(51) Int. Cl.
| | |
|---|---|
| *C30B 33/00* | (2006.01) |
| *G01B 11/30* | (2006.01) |
| *G01N 21/84* | (2006.01) |
| *G01N 21/88* | (2006.01) |
| *G01N 21/956* | (2006.01) |
| *H10P 74/20* | (2026.01) |

(52) U.S. Cl.
CPC ......... *G01B 11/30* (2013.01); *G01N 21/9505* (2013.01); *G01N 21/95607* (2013.01); *H10P 74/20* (2026.01); *H10P 74/203* (2026.01); *G01N 2021/8477* (2013.01); *G01N 2021/8864* (2013.01); *G06T 2207/30148* (2013.01)

(58) Field of Classification Search
CPC .............. G01N 21/88; G01N 21/8803; G01N 21/8806; G01N 21/8851; G01N 21/892; G01N 21/8921; G01N 21/8922; G01N 21/94; G01N 2021/4733; G01N 2021/8477; G01N 2021/8461; G01N 2021/8854; G01N 2021/8858; G01N 2021/8861; G01N 2021/8864; G01N 2021/8867; G01N 2021/887; G01N 2021/8874; G01N 2021/8877; G01N 2021/888; G01N 2021/8887; G01N 2021/8924; G01N 2021/8925; G01N 2021/945; G03F 7/7065; C30B 29/06; C30B 15/00; C30B 33/00; C30B 23/02; C30B 7/005; G03B 25/02; Y10T 117/1004; Y10T 117/1008; Y10T 117/1012; H10P 74/00; H10P 74/20; H10P 74/203; H10P 74/23; H10P 74/235; G01B 11/30; G01B 11/303; G01B 11/306; G06T 2207/30148
See application file for complete search history.

(56) References Cited

U.S. PATENT DOCUMENTS

| | | | | |
|---|---|---|---|---|
| 6,515,742 B1 * | 2/2003 | Ruprecht | ........... | G01N 21/9501 |
| | | | | 356/394 |
| 6,753,955 B2 | 6/2004 | Yagi | | |
| 6,876,445 B2 * | 4/2005 | Shibuya | ................. | G06T 7/001 |
| | | | | 382/145 |
| 7,097,718 B2 * | 8/2006 | Mule'Stagno | ........ | C30B 15/203 |
| | | | | 148/33.5 |
| 7,244,306 B2 * | 7/2007 | Kurita | ................... | C04B 24/003 |
| | | | | 117/14 |
| 8,135,207 B2 * | 3/2012 | Silberstein | ............. | G06V 10/98 |
| | | | | 382/145 |
| 8,349,075 B2 * | 1/2013 | Song | ....................... | C30B 29/06 |
| | | | | 117/11 |
| 8,670,605 B2 * | 3/2014 | Yanai | ...................... | H10P 74/23 |
| | | | | 382/141 |
| 8,736,832 B2 * | 5/2014 | Funada | .............. | G01N 21/9501 |
| | | | | 356/237.4 |
| 10,261,125 B2 * | 4/2019 | Nagasawa | ........ | G01R 31/31711 |
| 10,513,798 B2 * | 12/2019 | Tomii | ..................... | C30B 29/06 |
| 11,605,560 B2 * | 3/2023 | Yoon | ................. | G01N 21/6489 |
| 12,038,388 B2 * | 7/2024 | Hong | .............. | G01N 21/95607 |
| 12,092,588 B2 * | 9/2024 | Wei | ................... | G01N 21/95607 |
| 12,402,380 B2 * | 8/2025 | Leonard | ............ | G01N 21/6489 |
| 2004/0252879 A1 * | 12/2004 | Tiemeyer | .............. | G06T 7/0004 |
| | | | | 356/237.4 |
| 2008/0118712 A1 | 5/2008 | Schauer et al. | | |
| 2009/0169460 A1 | 7/2009 | Song et al. | | |
| 2011/0073041 A1 | 3/2011 | Schauer et al. | | |
| 2011/0242312 A1 * | 10/2011 | Seki | ................... | G01N 21/9505 |
| | | | | 348/125 |
| 2015/0168311 A1 * | 6/2015 | Seki | ................... | G01N 21/6489 |
| | | | | 356/51 |
| 2018/0136143 A1 | 5/2018 | Kato | | |
| 2019/0172758 A1 * | 6/2019 | Nishihara | .......... | G01N 21/9501 |
| 2019/0279890 A1 | 9/2019 | Mori | | |
| 2022/0223481 A1 * | 7/2022 | Zheng | ................... | H10P 74/203 |

FOREIGN PATENT DOCUMENTS

| | | | | | |
|---|---|---|---|---|---|
| CN | 111406129 A | * | 7/2020 | .......... | H01L 21/324 |
| JP | 2004193529 A | * | 7/2004 | | |
| JP | 2017-105653 A | | 6/2017 | | |
| JP | 6673122 B2 | * | 3/2020 | ............. | H01L 22/24 |
| KR | 20080025124 A | * | 3/2008 | ............. | H01L 22/20 |
| TW | 200427978 A | * | 12/2004 | ............. | G01N 21/94 |
| TW | 201229334 A | | 7/2012 | | |
| TW | 201708811 A | | 3/2017 | | |
| WO | WO-2008070722 A2 | * | 6/2008 | ........ | G01N 21/9501 |
| WO | WO-2021246101 A1 | * | 12/2021 | ............. | C30B 15/00 |

OTHER PUBLICATIONS

Office Action issued in Taiwan Counterpart Patent Appl. No. 111101973, dated Jan. 16, 2023, along with an English translation thereof.

International Search Report issued in WIPO Patent Application No. PCT/JP2022/001939, dated Mar. 22, 2022, along with an English translation thereof.

Office Action issued in Taiwan Counterpart Patent Appl. No. 11220059380, dated Jan. 16, 2023, along with an English translation thereof.

\* cited by examiner

FIG. 1

METHOD OF EVALUATING SILICON SINGLE-CRYSTAL INGOT, METHOD OF EVALUATING SILICON EPITAXIAL WAFER, METHOD OF MANUFACTURING SILICON EPITAXIAL WAFER, AND METHOD OF EVALUATING SILICON MIRROR POLISHED WAFER

CROSS-REFERENCE TO RELATED APPLICATIONS

This application claims the benefit of priority to Japanese Patent Application No. 2021-085883 filed on May 21, 2021, which is expressly incorporated herein by reference in its entirety.

TECHNICAL FIELD

The present invention relates to a method of evaluating a silicon single-crystal ingot, a method of evaluating a silicon epitaxial wafer, a method of manufacturing a silicon epitaxial wafer, and a method of evaluating a silicon mirror polished wafer.

BACKGROUND ART

Silicon wafers, which are widely used as semiconductor substrates, are manufactured by subjecting wafers, having been cut out from a silicon single-crystal ingot, to various processes such as polishing and film formation. Crystal defects in silicon wafers give rise to impaired device characteristics in semiconductor devices. Twins are known as one of such crystal defects (see Japanese Patent Application Publication No. 2017-105653, which is expressly incorporated herein by reference in its entirety).

SUMMARY OF INVENTION

As paragraph 0002 of Japanese Patent Application Publication No. 2017-105653 states, twins are planar defects that arise when stress acts in a certain direction during the growth of a silicon single crystal, with ensuing plastic deformation of the regular atomic arrangement by which one of adjacent portions is the mirror image of the other. It is desirable to identify a region in which twins are estimated to have occurred in a silicon single-crystal ingot, and to exclude such a region from a wafer cut-out region, since doing so allows providing a semiconductor device that exhibits excellent device characteristics.

One aspect of the present invention provides for a novel method of evaluating a silicon single-crystal ingot, allowing evaluation regarding a region in which a twin has occurred.

One aspect of the present invention relates to
a method of evaluating a silicon single-crystal ingot, the method including:
cutting out three or more plural silicon wafers from a silicon single-crystal ingot to be evaluated;
mirror polishing the plural silicon wafers to yield silicon mirror-surface wafers;
processing the plural silicon mirror polished wafers into silicon epitaxial wafers through formation of an epitaxial layer on the mirror polished surfaces;
acquiring light point defect maps of the epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers,
wherein in a case where a light point defect group in which three or more light point defects are linearly distributed is not confirmed in the overlay map, a region, from which the plural silicon wafers have been cut out, in the silicon single-crystal ingot to be evaluated, is estimated not to be a region in which a twin has occurred, and
in a case where the linearly-distributed light point defect group is confirmed in the overlay map, a region, from which the plural silicon wafers, for which light point defects included in the light point defect group have been confirmed, have been cut out, in the silicon single-crystal ingot to be evaluated, is estimated to be a region in which a twin has occurred.

In one embodiment, in the above method of evaluating a silicon single-crystal ingot, the linearly-distributed light point defect group may be a linearly-distributed light point defect group having a length of 2 mm or larger.

In one embodiment, the epitaxial layer formed in the above method of evaluating a silicon single-crystal ingot may be an epitaxial layer having a thickness of 0.5 μm or larger.

In one embodiment, in the above method of evaluating a silicon single-crystal ingot, in a case where a light point defect group in which three or more light point defects are linearly distributed is confirmed in the overlay map, the fact that a proportionality relationship holds between position coordinates of the light point defects and a cut-out position, in the axial direction of the silicon single-crystal ingot, of the plural silicon wafers for which light point defects included in the light point defect group have been confirmed, may be further utilized as an estimation criterion for estimating that a region from which the plural silicon wafers, for which light point defects included in the light point defect group have been confirmed, have been cut out is a region in which a twin has occurred.

In one embodiment, the plane orientation of the silicon single-crystal ingot to be evaluated may be <100>, and two regions where a {111} plane is present in the silicon single-crystal ingot may be further estimated to be a region in which a twin has occurred.

In one embodiment, the plane orientation of the silicon single-crystal ingot to be evaluated may be <100>, and in a case where the light point defect group in which three or more light point defects are linearly distributed is confirmed in the overlay map, for at least one of the plural light point defects, either one of two regions at which a {111} plane is present in the silicon single-crystal ingot to be evaluated may be further estimated to be a region in which a twin has occurred, on the basis of the shape of a defect observed with an atomic force microscope, the observed defect being present at the position at which the light point defect has been confirmed.

One aspect of the present invention relates to
a method of evaluating a silicon epitaxial wafer,
wherein silicon epitaxial wafers to be evaluated are three or more silicon epitaxial wafers resulting from formation of an epitaxial layer on mirror polished surfaces of silicon mirror polished wafers having been cut out from a same silicon single-crystal ingot and having been processed to a mirror finish, the method includes:

acquiring light point defect maps of the epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers, in a case where a light point defect group in which three or more light point defects are linearly distributed is not confirmed in the overlay map, estimation is made that no twin-induced defect is present in the silicon epitaxial wafers to be evaluated, and in a case where the linearly-distributed light point defect group is confirmed, estimation is made that a twin-induced defect is present in the plural silicon epitaxial wafers for which light point defects included in the light point defect group have been confirmed.

In one embodiment, in the above method of evaluating a silicon epitaxial wafer, the linearly-distributed light point defect group may be a linearly-distributed light point defect group having a length of 2 mm or larger.

In one embodiment, in the above method of evaluating a silicon epitaxial wafer, the epitaxial layer may be an epitaxial layer having a thickness of 0.5 μm or larger.

In one embodiment, in the above method of evaluating a silicon epitaxial wafer, in a case where a light point defect group in which three or more light point defects are linearly distributed is confirmed in the overlay map, the fact that a proportionality relationship holds between position coordinates of the light point defects and a cut-out position, in the axial direction of the silicon single-crystal ingot, of the plural silicon wafers for which light point defects included in the light point defect group have been confirmed, may be further utilized as an estimation criterion for estimating that a twin-induced defect is present in the plural silicon epitaxial wafers for which light point defects included in the light point defect group have been confirmed.

One aspect of the present invention relates to a method of manufacturing a silicon epitaxial wafer, the method including:

cutting out three or more silicon wafers from a same silicon single-crystal ingot;

mirror polishing the plural silicon wafers to yield silicon mirror-surface wafers;

processing the plural silicon mirror polished wafers into silicon epitaxial wafers through formation of an epitaxial layer on the mirror polished surfaces;

evaluating the plural silicon epitaxial wafers by the above method of evaluating a silicon epitaxial wafer; and subjecting a silicon epitaxial wafer estimated not to have a twin-induced defect present therein, as a result of the evaluation, to one or more processes for shipping as a product silicon epitaxial wafer.

One aspect of the present invention relates to a method of evaluating a silicon mirror polished wafer, wherein silicon mirror polished wafers to be evaluated are silicon mirror polished wafers cut out from a same silicon single-crystal ingot and having been processed to a mirror finish, the method includes:

processing the plural silicon mirror-surface wafers into silicon epitaxial wafers through formation of an epitaxial layer on the mirror polished surfaces;

acquiring light point defect maps of the epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers, in a case where a light point defect group in which three or more light point defects are linearly distributed is not confirmed in the overlay map, estimation is made that no twin is present in the silicon mirror polished wafers to be evaluated, and in a case where the linearly-distributed light point defect group is confirmed, estimation is made that a twin is present in a silicon mirror polished wafer included in the plural silicon epitaxial wafers for which light point defects included in the light point defect group have been confirmed.

In one embodiment, in the above method of evaluating a silicon mirror polished wafer, the linearly-distributed light point defect group may be a linearly-distributed light point defect group having a length of 2 mm or larger.

In one embodiment, in the above method of evaluating a silicon mirror polished wafer, the epitaxial layer may be an epitaxial layer having a thickness of 0.5 μm or larger.

In one embodiment, in the above method of evaluating a silicon mirror polished wafer, in a case where a light point defect group in which three or more light point defects are linearly distributed is confirmed in the overlay map, the fact that a proportionality relationship holds between position coordinates of the light point defects and a cut-out position, in the axial direction of the silicon single-crystal ingot, of the plural silicon epitaxial wafers for which light point defects included in the light point defect group have been confirmed, may be further utilized as an estimation criterion for estimating that a twin is present in a silicon mirror polished wafer included in the plural silicon epitaxial wafers for which light point defects included in the light point defect group have been confirmed.

One aspect of the present invention can provide a novel method of evaluating a silicon single-crystal ingot, allowing evaluation regarding a region in which a twin has occurred.

BRIEF DESCRIPTION OF DRAWINGS

FIG. 1 illustrates a specific example of an overlay map resulting from overlaying of light point defect maps acquired for epitaxial layer surfaces of a plural silicon epitaxial wafers.

DESCRIPTION OF EMBODIMENTS

[Method of Evaluating Silicon Single-Crystal Ingot]

Figure 2:
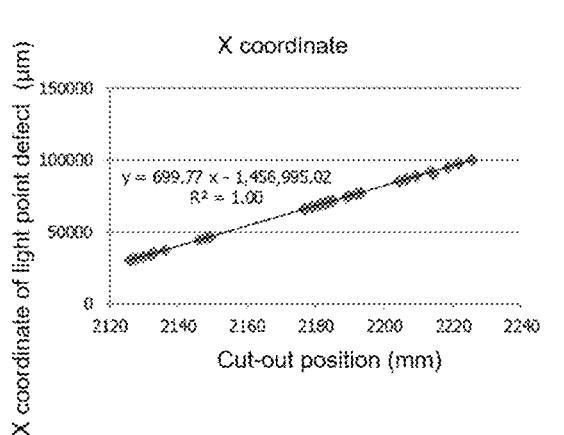
FIG. 2 is a graph resulting from plotting position coordinates (X coordinate or Y coordinate) of light point defects on silicon wafers for which light point defects included in a linearly-distributed light point defect group have been confirmed in the overlay map illustrated in FIG. 1, versus a cut-out position of the silicon wafers in the axial direction of the silicon single-crystal ingot to be evaluated.
Figure 2:
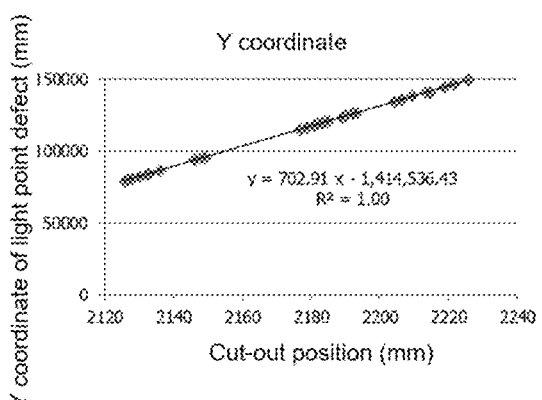

A method of evaluating a silicon single-crystal ingot according to one aspect of the present invention includes: cutting out three or more silicon wafers from a silicon single-crystal ingot to be evaluated; mirror polishing the plural silicon wafers to yield silicon mirror polished wafers;

processing the plural silicon mirror polished wafers to silicon epitaxial wafers through formation of an epitaxial layer on the mirror polished surfaces; acquiring light point defect maps of the epitaxial layer surfaces of the plural silicon epitaxial wafers with a laser surface inspection device; and creating an overlay map resulting from over-laying of the light point defect maps acquired for the epitaxial layer surfaces of the plural silicon epitaxial wafers. In the above method of evaluating a silicon single-crystal ingot, in a case where a light point defect group in which three or more light point defects are linearly distributed is not confirmed in the overlay map, a region, from which the plural silicon wafers have been cut out, in the silicon single-crystal ingot to be evaluated, is estimated not to be a region in which a twin has occurred, and in a case where the linearly-distributed light point defect group is confirmed in the overlay map, a region, from which the plural silicon wafers, for which light point defects included in the light point defect group have been confirmed, have been cut out, in the silicon single-crystal ingot to be evaluated, is esti-mated to be a region in which a twin has occurred.

The present inventors arrived at the new findings below in exhaustive studies aimed at providing a novel method of evaluating silicon single-crystal ingots such that the method allows evaluation regarding a region in which a twin has occurred.

(1) Upon mirror polishing of a silicon wafer that includes the twin and formation of an epitaxial layer on the resulting mirror polished surface, crevasse-like recessed surface defects become formed in the epitaxial layer that has been formed. The underlying cause for the above is surmised to be the difference in epitaxial growth rates between the portion directly above the twin and other portions, such that a crevasse-like recessed surface defect becomes formed at a portion directly above the twin, in the formed epitaxial layer. A surface defect thus formed can therefore be estimated to be a twin-indued defect.

(2) The above surface defects can be detected in the form of light point defects (LPDs) with a laser surface inspection device.

(3) The twin occurs in one certain direction in a silicon single-crystal ingot.

Therefore, upon processing of three or more silicon wafers, cut out from a same silicon single-crystal ingot, to silicon mirror polished wafers, acquisition of light point defect maps, with a laser surface inspection device, of epitaxial layer surfaces resulting from formation of an epitaxial layer on the mirror polished surfaces, and creation of a map resulting from overlaying of the obtained plural light point defect maps, then those light point defects, in the overlay map, corresponding to surface defects estimated to be a twin-induced defect, can be confirmed to be a linearly-distributed light point defect group.

The present inventors conducted diligent research on the basis of these findings, and as a result, completed the above novel method of evaluating a silicon single-crystal ingot.

The above method of evaluating a silicon single-crystal ingot will be explained in detail below.

<Silicon Single-Crystal Ingot to be Evaluated>

The silicon single-crystal ingot to be evaluated in the above method of evaluating a silicon single-crystal ingot may be, for example, a silicon single-crystal ingot grown in accordance with the Czochralski (CZ) method. As previ-ously mentioned, twins are planar defects that arise when stress acts in a certain direction during the growth of a silicon single crystal, with ensuing plastic deformation of the regular atomic arrangement such that one of adjacent portions is a mirror image of the other. Twins are known as planar defects that can occur in silicon single-crystal ingots grown in accordance with the Czochralski (CZ) method. Known techniques pertaining to the CZ method can be applied for growing the silicon single-crystal ingot.

<Cutting of Silicon Wafers and Processing to Silicon Mirror-Surface Wafers>

In the above method of evaluating a silicon single-crystal ingot, three or more silicon wafers are cut out from a silicon single-crystal ingot to be evaluated, for the purpose of allowing evaluation regarding a region in which a twin has occurred in the silicon single-crystal ingot. Cutting of the silicon wafers can be accomplished, for example, as follows. The silicon single-crystal ingot to be evaluated is cut to obtain a block. The obtained block is sliced into wafers. With the pull-up direction at the time of growth in the axial direction being referred to herein as the upward direction, and the other direction being referred to as the downward direction, the silicon single-crystal ingot grown in accor-dance with the CZ method has present therein a cylindrical portion referred to as a straight body part, between an upper conical portion (referred to as "shoulder") and a lower conical portion (referred to as "tail"). The block may be, for example, a cylindrical block obtained by cutting out a partial region of the straight body part. In one embodiment, the above three or more silicon wafers may be plural silicon wafers cut out from contiguous regions in the silicon single-crystal ingot to be evaluated, that is, may be silicon wafers obtained by so-called continuous sampling. In another embodiment, the above three or more silicon wafers may be plural silicon wafers cut out from separate regions in the silicon single-crystal ingot to be evaluated, that is, may be silicon wafers obtained by so-called random sampling. When random sampling is performed, it is not possible to evaluate the twin included in a region positioned between regions in which random sampling is carried out; therefore, it is preferable to obtain the above three or more silicon wafers by continuous sampling, from the viewpoint of increasing the reliability of estimation results of a region in which a twin has occurred in the silicon single-crystal ingot to be evaluated. The thickness of each of the plural silicon wafers can be, for example, from 750 μm to 1 mm. The region in which continuous sampling is performed can be a region extending over 80 mm or more in the axial direction of the silicon single-crystal ingot; the length of the region may be, for example, 440 mm or less, but may be longer than that. The total number of the plural silicon wafers can be, for example, 10 or more, or 50 or more, or 70 or more, or 100 or more, and may be, for example, 500 or fewer, or 300 or fewer, or 200 or fewer; however, the total number of wafers may exceed the values given here.

Three or more silicon wafers cut out from the silicon single-crystal ingot to be evaluated are processed to a mirror finish, on one or both of the two main surfaces of the wafers, to yield silicon mirror polished wafers. In the present invention and in the present specification, the term "silicon mirror polished wafer" denotes a silicon single-crystal wafer having one or both of the two main surfaces thereof pro-cessed to a mirror finish. Mirror polishing can be performed in accordance with a known method. The silicon wafers before mirror polishing may be subjected, in accordance with known methods, to various processes such as cham-fering, lapping, grinding and rough polishing, which are ordinarily performed in order to obtain silicon mirror pol-ished wafers. Three or more silicon mirror polished wafers are obtained that way.

<Processing to a Silicon Epitaxial Wafer>

The three or more silicon mirror polished wafers obtained above are processed into respective silicon epitaxial wafers. A silicon epitaxial wafer is herein a wafer having a silicon single-crystal wafer as a substrate, and having an epitaxial layer on this substrate. In the present invention and the present specification, an epitaxial layer denotes an epitaxial layer of a silicon single crystal. Formation of epitaxial layers on the three or more silicon mirror polished wafers obtained above is accomplished with each silicon mirror polished wafer as a substrate and by epitaxially growing a silicon single crystal on the mirror polished surface of that substrate. A known technique pertaining to silicon epitaxial wafers can be applied for forming the epitaxial layer. In a case where the silicon mirror polished wafers are wafers resulting from mirror polishing of silicon wafers cut out from a region in which a twin has occurred, the present inventors surmise that upon formation of an epitaxial layer on the mirror polished surfaces, as described above, a crevasse-like recessed surface defect becomes formed at a portion directly above the twin, in the formed epitaxial layer. Therefore, such a surface defect can be estimated to be a twin-induced defect. In the above method of evaluating a silicon single-crystal ingot, estimation regarding a region in which a twin has occurred is accomplished, as set forth in detail below, on the basis of the presence or absence of such surface defects and on the basis of the state in which the surface defects are present. The epitaxial layer is preferably formed to a thickness of 0.5 μm or larger, on the silicon mirror polished wafers, from the viewpoint of facilitating detection with a laser surface inspection device by increasing the visibility, on the epitaxial layer surface, of surface defects induced by the twin. The thickness of the epitaxial layer that is to be formed may be, for example, 1.0 μm or smaller, but may exceed 1.0 μm.

<Acquisition of Light Point Defect Maps by Laser Surface Inspection Device>

In the above method of evaluating a silicon single-crystal ingot, light point defect maps are acquired with a laser surface inspection device for the respective epitaxial layer surfaces of the three or more silicon epitaxial wafers obtained above. As the laser surface inspection device which can be used, without any limitations, a laser surface inspection device having a known configuration as a device for inspecting the surface of semiconductor wafers, also referred to as a light-scattering type surface inspection device, a surface inspection machine or the like. A laser surface inspection device ordinarily scans, with laser light, the surface of a semiconductor wafer to be evaluated, and detects, relying on radiated light (scattered light or reflected light), small recesses or small protrusions (for example, recessed surface defects or protruding surface-deposited foreign matter) on the surface to be evaluated of the wafer. The position and/or size of small recesses and small protrusions on the surface to be evaluated of the semiconductor wafer can be ascertained through measurement of radiated light from the light point defects. For example, ultraviolet light, visible light or the like, of no particularly limited wavelength, can be used as the laser light. Ultraviolet light denotes light in a wavelength region shorter than 400 nm, and visible light denotes light in the wavelength region from 400 to 600 nm. An analysis unit of the laser surface inspection device usually acquires information of two-dimensional position coordinates (X coordinate and Y coordinate) about the surface to be evaluated, for each of the detected pluralities of light point defects, to allow creating a light point defect map that denotes an in-plane light point defect distribution state for each surface to be evaluated on the basis of the acquired information of the two-dimensional position coordinates. Specific examples of commercially available laser surface inspection devices include the Surfscan series SP1, SP2, SP3, SP5, SP7 and the like by KLA TENCOR Inc. However, the above devices are examples, and other laser surface inspection devices can be used.

<Estimation of Region in which Twin has Occurred>

In a case where the silicon mirror polished wafers are silicon wafers that have been cut out from a region in which a twin has occurred and having been mirror polished, the present inventors surmise that when an epitaxial layer is formed on the resulting mirror polished surface, crevasse-like recessed surface defects become formed at a portion directly above the twin on the formed epitaxial layer, as described above. The laser surface inspection device allows detecting, as light point defects, small recesses in the surface to be evaluated; accordingly, such surface defects can be detected as light point defects with the laser surface inspection device. It is, however, possible that small recesses or small protrusions detected as light point defects with the laser surface inspection device, on the epitaxial layer surfaces of the plural silicon epitaxial wafers, may be not only surface defects induced by the twin. In the above method of evaluating a silicon single-crystal ingot, therefore, estimation regarding a region in which a twin has occurred in the silicon single-crystal ingot to be evaluated is conducted exploiting the fact that the twin is a planar defect that occurs in a certain direction in a silicon single-crystal ingot. Specifically, the twin occurs in a certain direction in a silicon single-crystal ingot. Therefore, when light point defect maps are acquired with the laser surface inspection device for the surfaces of the epitaxial layers of the silicon epitaxial wafers cut out from a same silicon single-crystal ingot and having undergone the above treatment, as described above, upon creation of a map resulting from overlaying the plural light point defect maps, light point defects corresponding to surface defects estimated to be a twin-induced defect, can be identified as a linearly-distributed light point defect group. In the above method of evaluating a silicon single-crystal ingot, therefore, evaluation regarding a region in which a twin has occurred is performed for the silicon single-crystal ingot to be evaluated, as described below.

The overlay map is created by overlaying the light point defect maps acquired for the epitaxial layer surfaces of the above plural silicon epitaxial wafers. The overlay map can be created in the analysis unit of the laser surface inspection device, or can be created using known analysis software. An estimation criterion A below is relied upon for estimating a region in which a twin has occurred.

(Estimation Criterion A)

In a case where a light point defect group in which three or more light point defects are linearly distributed is not confirmed in the created overlay map, a region from which the plural silicon wafers has been cut out, in the silicon single-crystal ingot to be evaluated, is estimated not to be a region in which a twin has occurred. In contrast, in a case where a light point defect group in which three or more light point defects are linearly distributed is confirmed in the overlay map, a region, from which the plural silicon wafers, for which light point defects included in the light point defect group have been confirmed, have been cut out, in the silicon single-crystal ingot to be evaluated, is estimated to be a region in which a twin has occurred.

Figure 1:
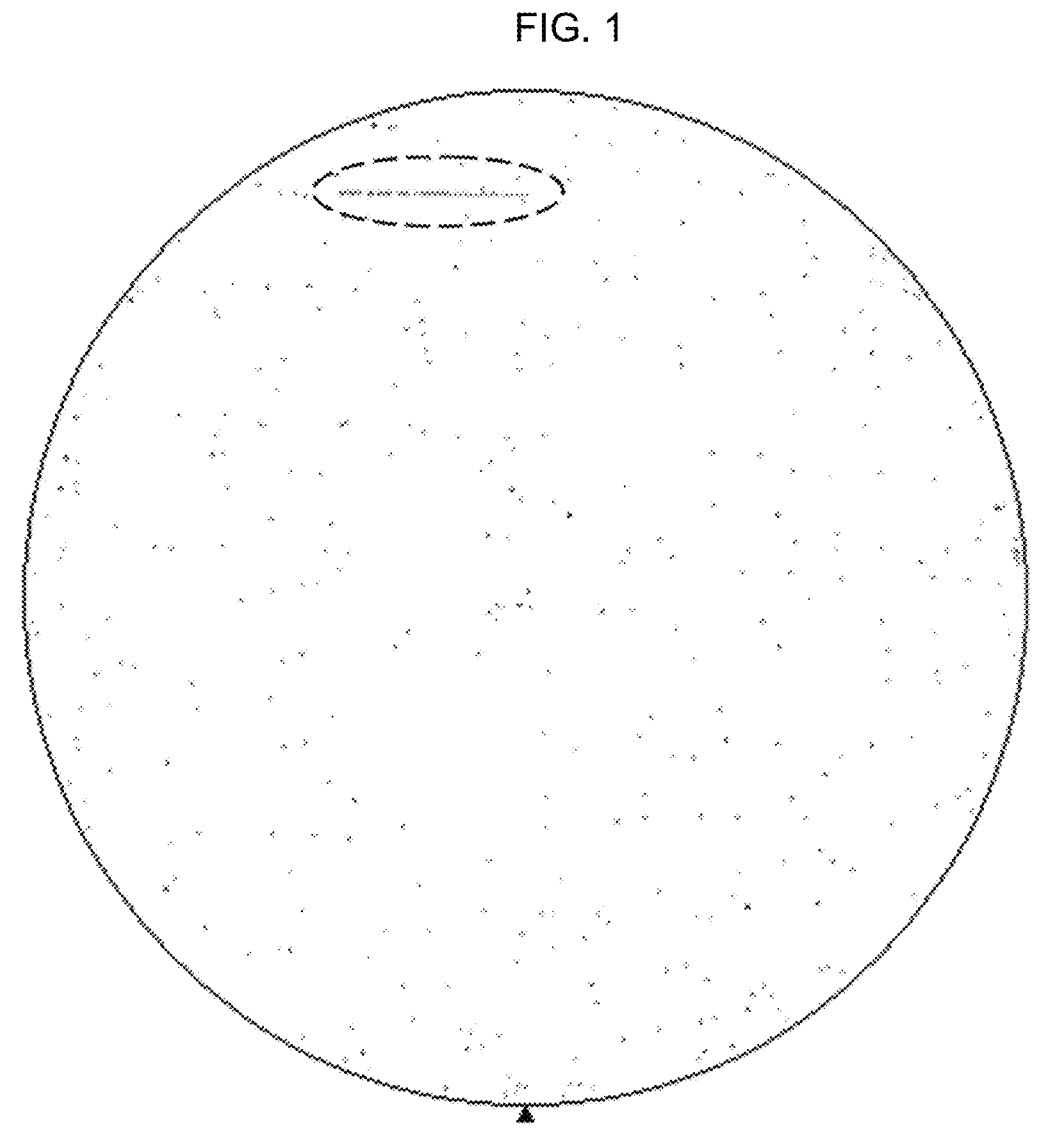

As an example, FIG. 1 illustrates a specific example of an overlay map. The overlay map illustrated in FIG. 1 is an overlay map created in accordance with the following method.

A silicon single-crystal ingot having a plane orientation <100> was grown in accordance with the Czochralski method.

A block was obtained by cutting a region extending over a length of about 110 mm in the axial direction, from the straight body part of the grown silicon single-crystal ingot. Then wafers having a thickness of 1 mm were continuously sliced from the obtained block, to yield a total of 78 silicon wafers, by continuous sampling.

The obtained silicon wafers were processed to silicon mirror polished wafers in accordance with a known method.

Silicon single crystals were epitaxially grown, in accordance with a known method, on mirror polished surface of the silicon mirror polished wafers obtained above, to form respective epitaxial layers having a thickness of 0.5 μm, and thereby process the wafers into silicon epitaxial wafers.

For each epitaxial layer surface of the obtained plural silicon epitaxial wafers (300 mm diameter), there was acquired a light point defect map of the epitaxial layer surface using Surfscan series SP5 by KLA TENCOR Inc., as a laser surface inspection device. The overlay map illustrated in FIG. 1 is an overlay map obtained by overlaying the light point defect maps obtained for the plural silicon epitaxial wafers in the analysis unit of the laser surface inspection device.

In the overlay map illustrated in FIG. 1, a linearly-distributed light point defect group having a length of about 60 mm can be found at the portion enclosed by the dotted line in FIG. 1. In the present invention and the present specification, the language "linearly-distributed light point defect group" denotes a light point defect group such that the distribution shape of the light point defect group is a straight line shape. The straight line shape as notated herein is not limited to a perfect straight line, and encompasses shapes generally recognizable as substantially straight lines. In the linearly-distributed light point defect group, it is not essential that adjacent light point defects be in contact with each other; adjacent light point defects may be in contact with each other or may be spaced from each other. In addition, the length of the linearly-distributed light point defect group denotes the full-scale size, that is, the actual size, on the surface of the epitaxial layer. The length of the linearly-distributed light point defect group denotes the distance between a light point defect at one end and a light point defect at the other end, in the linearly-distributed light point defect group; for example, the length of the linearly-distributed light point defect group may be 2 mm or larger, or may be, for example, 100 mm or smaller, but may in some instances be larger than that. The overlay map illustrated in FIG. 1 was acquired using the Surfscan series SP5 by KLA TENCOR Inc. as a laser surface inspection device, although it has been confirmed that similar overlay maps can be obtained using SP1, SP2, SP3, SP5 and SP7 of the same series.

In one embodiment, one, two or three from among additional estimation criteria 1A to 3A below can be utilized, in addition to estimation criterion A, exploiting the fact that the twin is a planar defect that occurs in a certain direction in a silicon single-crystal ingot.

(Additional Estimation Criterion 1A)

In a case where a light point defect group in which three or more light point defects are linearly distributed is confirmed in the overlay map, a region, from which the plural silicon wafers, for which light point defects included in the light point defect group have been confirmed, has been cut out, is estimated to be a region in which a twin has occurred, on the basis of the fact that a proportionality relationship holds between position coordinates of the light point defects and a cut-out position, in the axial direction of the silicon single-crystal ingot, of the plural silicon wafers for which light point defects included in the light point defect group have been confirmed.

FIG. 2 is a graph resulting from plotting the position coordinates (X coordinate or Y coordinate) of light point defects on a silicon wafer for which light point defect included in a linearly-distributed light point defect group have been confirmed in the overlay map illustrated in FIG. 1, versus the cut-out position of the silicon wafers in the axial direction of the silicon single-crystal ingot to be evaluated. In the graph illustrated in FIG. 2, the horizontal axis denotes axial position, with the position of shoulder-side apex of the silicon single-crystal ingot at zero mm. Concerning the additional estimation criterion 1A, the wording "a proportionality relationship holds" denotes herein that a straight line can be created through fitting by least-squares in the vertical axis y and the horizontal axis x, such that the square of a correlation coefficient $R^2$ is from 0.80 to 1.00. In the graph illustrated in FIG. 2, a straight line having $R^2=0.80$ to 1.00 could be created, through fitting by least squares in the vertical axis y and the horizontal axis x, for both the X coordinate and the Y coordinate. The proportionality relationship described for additional estimation criterion 1 is herein prescribed to hold for at least one of the X coordinate and the Y coordinate from among the position coordinates of the light point defects, and preferably holds for both.

(Additional Estimation Criterion 2A)

The plane orientation of the silicon single-crystal ingot to be evaluated is <100>, and two regions where a {111} plane is present in the silicon single-crystal ingot are further estimated to be a region in which a twin has occurred.

(Additional Estimation Criterion 3A)

In a case where the plane orientation of the silicon single-crystal ingot to be evaluated is <100> and a light point defect group in which three or more light point defects are linearly distributed is confirmed in the overlay map, then for at least one of the plural light point defects, a defect, present at the position at which the light point defect has been confirmed, is observed with an atomic force microscope, either one of two regions at which a {111} plane is present in the silicon single-crystal ingot to be evaluated is further estimated to be a region in which a twin has occurred, on the basis of the shape of the defect observed.

The additional estimation criteria 2A and 3A above are based on the following crystallographic findings.

Finding 1: in silicon single crystals having a <100> plane orientation, twins propagate along {111} planes.

Figure 3:
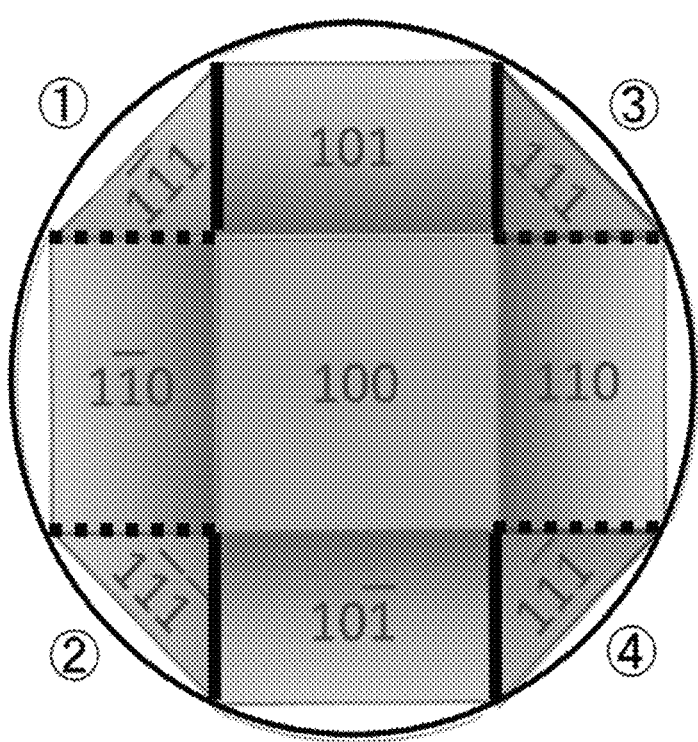
FIG. 3 is an explanatory diagram of the crystal lattice of a silicon single crystal having a <100> plane orientation.

Finding 2: FIG. 3 is an explanatory diagram of the crystal lattice of a silicon single crystal having a <100> plane orientation. In a silicon single-crystal ingot with plane orientation <100>, distribution lines of the linearly-distributed light point defect groups in the overlay map created as described above, lie on the boundary lines between the {111} planes and the {110} planes. Such boundary lines are the boundary lines denoted by solid lines and boundary lines denoted by dotted lines in FIG. 3.

According to the additional estimation criterion 2A, the two regions at which {111} planes of circle 3 and circle 4, from among the regions at which {111} planes in circle 1, circle 2, circle 3 and circle 4 are present in FIG. 3 can be estimated to be a region in which a twin has occurred, from the tilt relative to the crystal growth direction (axial direction of the silicon single-crystal ingot), on the basis of finding 1 and finding 2.

Figure 4:
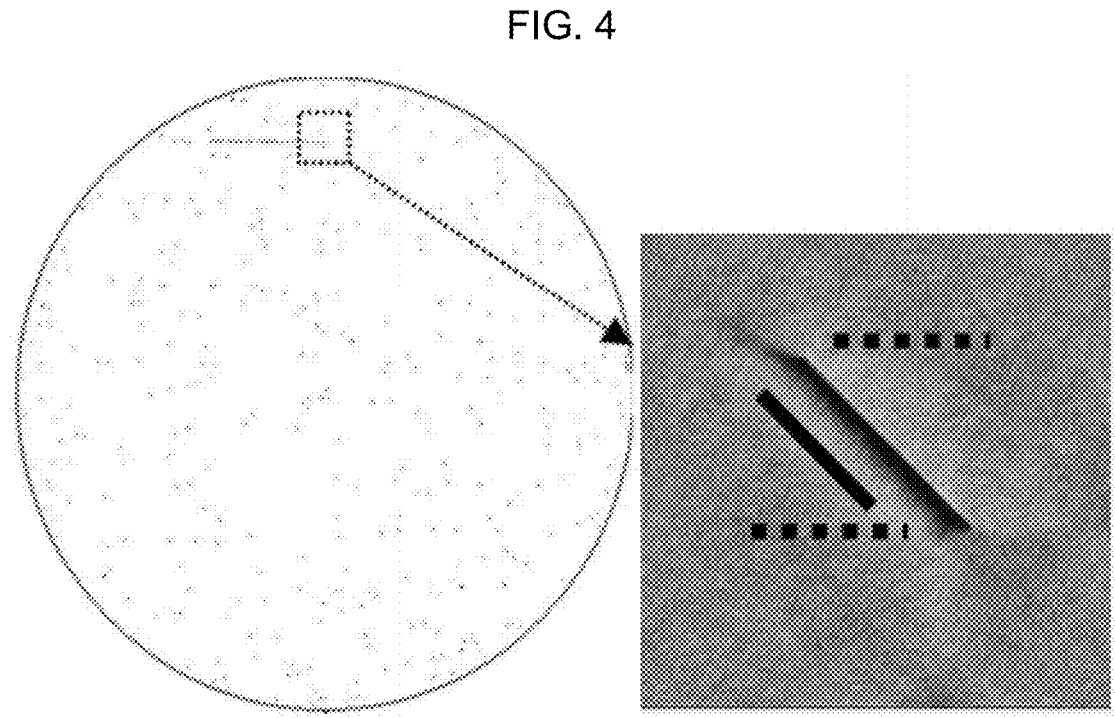
FIG. 4 is an AFM image acquired through observation, with an atomic force microscope (AFM), of one of the light point defects included in the linearly-distributed light point defect group in the overlay map illustrated in FIG. 1.

According to the additional estimation criterion 3A, in a case where a light point defect group in which the three or more light point defects are linearly distributed is confirmed in the overlay map, a defect present at a position at which the light point defect has been confirmed is observed, with an atomic force microscope, for at least one of the plural light point defects. FIG. 4 is an AFM image acquired through observation, using an atomic force microscope (AFM), of one of the light point defects included in the linearly-distributed light point defect group in the overlay map illustrated in FIG. 1. In the AFM image illustrated in FIG. 4 the twin can estimated to have occurred in the direction denoted the solid line. In the AFM image illustrated in FIG. 4, partial dislocations can be estimated to have occurred in the directions denoted by the dotted lines. The directions denoted by the dotted lines in FIG. 4 match the directions of the boundary lines denoted by the dotted lines in the crystal lattice illustrated in FIG. 3. According to the additional estimation criterion 2A, two regions in which {111} planes of circle 3 and circle 4 in FIG. 3 are present can be estimated to be a region in which a twin has occurred, as described above. In contrast, according to additional estimation criterion 3A, a region at which the {111} plane of circle 3 in FIG. 3 is present can be estimated to be a region in which a twin has occurred on the basis of the tilt with respect to the crystal growth direction (axial direction of the silicon single-crystal ingot) and on the basis of the direction (for example, the direction denoted the solid line in FIG. 4) in which the twin has been estimated to have occurred in the AFM image.

The above method of evaluating a silicon single-crystal ingot allows evaluation regarding a region in which a twin has occurred in a silicon single-crystal ingot, as described above.

[Method of Evaluating Silicon Epitaxial Wafer]

In the method of evaluating a silicon epitaxial wafer according to one aspect of the present invention, silicon epitaxial wafers to be evaluated are three or more silicon epitaxial wafers resulting from formation of an epitaxial layer on mirror polished surfaces of silicon mirror polished wafers having been cut out from a same silicon single-crystal ingot and having been processed to a mirror finish, and the method includes acquiring light point defect maps of the epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers. In a case where a light point defect group in which three or more light point defects are linearly distributed is not confirmed in the overlay map, estimation is made that no twin-induced defect is present in the silicon epitaxial wafers to be evaluated, and in a case where the linearly-distributed light point defect group is confirmed, estimation is made that a twin-induced defect is present in the plural silicon epitaxial wafers for which light point defects included in the light point defect group have been confirmed.

The above disclosures concerning a silicon single-crystal ingot, a silicon mirror polished wafer, a silicon epitaxial wafer, acquisition of light point defect maps and creation of an overlay map, as pertaining to the above method of evaluating a silicon single-crystal ingot, can be referred to concerning the above method of evaluating a silicon epitaxial wafer. The above method of evaluating a silicon epitaxial wafer conducts evaluation regarding a twin-induced defect according to estimation criterion B below. The twin-induced defect denotes herein a surface defect appearing on the surface of a silicon epitaxial wafer due to the twin included in the substrate (that is, a silicon mirror polished wafer), of the silicon epitaxial wafer, on which an epitaxial layer is provided. As described above, such surface defects may be crevasse-like recessed surface defects. The above disclosure pertaining to the estimation criterion A can be referred to for the estimation criterion B.

(Estimation Criterion B)

In a case where a light point defect group in which three or more light point defects are linearly distributed is not confirmed in the created overlay map, estimation is made that no twin-induced defect is present in the silicon epitaxial wafers to be evaluated. In contrast, in a case where a light point defect group in which three or more light point defects are linearly distributed is confirmed in the overlay map, estimation is made that a twin-induced defect is present in the plural silicon epitaxial wafers for which light point defects included in the light point defect group have been confirmed.

In the above method of evaluating a silicon epitaxial wafer, an additional estimation criterion 1B below can be further utilized, in addition to the estimation criterion B, exploiting the fact that a twin is a planar defect that occurs in a certain direction in a silicon single-crystal ingot. The above disclosure pertaining to the additional estimation criterion 1A can be referred to concerning the additional estimation criterion 1B.

(Additional Estimation Criterion 1B)

In a case where a light point defect group in which three or more light point defects are linearly distributed is confirmed in the overlay map, it is estimated that a twin-induced defect is present in the plural silicon epitaxial wafers for which light point defects included in the light point defect group have been confirmed, on the basis of the fact that a proportionality relationship holds between position coordinates of the light point defects and a cut-out position, in the axial direction of the silicon single-crystal ingot, of the plural silicon epitaxial wafers for which light point defects included in the light point defect group have been confirmed.

[Method of Manufacturing Silicon Epitaxial Wafer]

The method of manufacturing a silicon epitaxial wafer according to one aspect of the present invention includes: cutting out three or more silicon wafers from a same silicon single-crystal ingot; mirror polishing the plural silicon wafers to yield silicon mirror-surface wafers; processing the plural silicon mirror-surface wafers to silicon epitaxial wafers through formation of an epitaxial layer on the mirror polished surfaces; evaluating the plural silicon epitaxial wafers in accordance with the above method of evaluating a silicon epitaxial wafer; and subjecting a silicon epitaxial wafer estimated not to have a twin-induced defect present therein, as a result of the evaluation, to one or more processes for shipping as a product silicon epitaxial wafer. Specific examples of processes for shipping as a product silicon epitaxial wafer include a packing process and the like.

The above method of manufacturing a silicon epitaxial wafer allows shipping, as a product silicon epitaxial wafer, a silicon epitaxial wafer having been estimated not to have a twin-induced defect present therein, that is, not to have present therein a surface defect that appears on the surface of the silicon epitaxial wafer and that derives from the twin included in the substrate (silicon mirror polished wafer) of the silicon epitaxial wafer. Producing a semiconductor device using the product silicon epitaxial wafer thus shipped allows contributing to providing a semiconductor device that can exhibit excellent device characteristics.

The above disclosure pertaining to the above method of evaluating a silicon single-crystal ingot and the above disclosure pertaining to the above method of evaluating a silicon epitaxial wafer can be referred to for details on the above method of manufacturing a silicon epitaxial wafer.

[Method of Evaluating Silicon Mirror Polished Wafer]

In the method of evaluating a silicon mirror polished wafer according to one aspect of the present invention, silicon mirror polished wafers to be evaluated are silicon mirror polished wafers cut out from a same silicon single-crystal ingot and having been processed to a mirror finish, the method includes processing the plural silicon mirror-surface wafers into silicon epitaxial wafers through formation of an epitaxial layer on the mirror polished surfaces; acquiring light point defect maps of the epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers. The above disclosures concerning a silicon single-crystal ingot, a silicon mirror polished wafer, a silicon epitaxial wafer, acquisition of light point defect maps and creation of an overlay map, as pertaining to the above method of evaluating a silicon single-crystal ingot, can be referred to concerning the above method of evaluating a silicon mirror polished wafer. In the above method of evaluating a silicon mirror polished wafer, the twin in the silicon mirror polished wafers are evaluated based on an estimation criterion C below. The above disclosure pertaining to estimation criterion A can be referred to for the estimation criterion C.

(Estimation Criterion C)

In a case where a light point defect group in which the three or more light point defects are linearly distributed is not confirmed in the overlay map, it is estimated that no twin is present in a silicon mirror polished wafer to be evaluated. In contrast, in a case where a light point defect group in which three or more light point defects are linearly distributed is confirmed in the overlay map, it is estimated that a twin is present in a silicon mirror polished wafer included in the plural silicon epitaxial wafers for which light point defects included in the light point defect group have been confirmed.

In the above method of evaluating a silicon mirror polished wafer, an additional estimation criterion 1C below can be further utilized, in addition to the estimation criterion C, exploiting the fact that a twin is a planar defect that occurs in a certain direction in a silicon single-crystal ingot. The above disclosure pertaining to the additional estimation criterion 1A can be referred to concerning the additional estimation criterion 1C.

(Additional Estimation Criterion 1C)

In a case where a light point defect group in which three or more light point defects are linearly distributed is confirmed in the overlay map, it is estimated that a twin is present in a silicon mirror polished wafer included in the plural silicon epitaxial wafers for which light point defects included in the light point defect group have been confirmed, on the basis of the fact that a proportionality relationship holds between position coordinates of the light point defects and a cut-out position, in the axial direction of the silicon single-crystal ingot, of the plural silicon epitaxial wafers for which light point defects included in the light point defect group have been confirmed.

As described above, a twin occurs in a certain direction of a silicon single-crystal ingot. Therefore, for example, by conducting evaluation, by the above method of evaluating a silicon mirror polished wafer, for some of plural silicon mirror polished wafers having been cut out from a same silicon single-crystal ingot and having been processed to silicon mirror polished wafers, it becomes possible to estimate the presence or absence of a region in which a twin has occurred and to estimate the position of a region in which a twin has occurred, in the silicon single-crystal ingot. As a result of the above estimation, it becomes possible to specify the region, in the silicon single-crystal ingot, estimated to be twin-free. A silicon mirror polished wafer obtained by processing a wafer cut out from the region thus specified can be subjected to one or more steps for shipping the wafer as a product wafer. For example, determining a silicon mirror polished wafer that is to be shipped as a product wafer as described above allows contributing to shipping twin-free silicon mirror polished wafers as product wafers.

One aspect of the present invention is useful in the field of silicon single-crystal ingot manufacture, in the field of silicon epitaxial wafer manufacture, and in the field of silicon mirror polished wafer manufacture.

The invention claimed is:

1. A method of evaluating a silicon single-crystal ingot, comprising:

cutting out three or more plural silicon wafers from a silicon single-crystal ingot to be evaluated;

mirror polishing the plural silicon wafers to yield silicon mirror-surface wafers;

processing the plural silicon mirror polished wafers into silicon epitaxial wafers through formation of an epitaxial layer on the mirror polished surfaces;

acquiring light point defect maps of epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers, wherein in a case where a light point defect group in which three or more light point defects are linearly distributed is not confirmed in the overlay map, a region, from which the plural silicon wafers have been cut out, in the silicon single-crystal ingot to be evaluated, is estimated not to be a region in which a twin has occurred, and in a case where the linearly-distributed light point defect group is confirmed in the overlay map, a region, from which the plural silicon wafers, for which light point defects included in the light point defect group have been confirmed, have been cut out, in the silicon single-crystal ingot to be evaluated, is estimated to be a region in which a twin has occurred.

2. The method of evaluating a silicon single-crystal ingot according to claim 1, wherein the linearly-distributed light point defect group is a linearly-distributed light point defect group having a length of 2 mm or larger.

3. The method of evaluating a silicon single-crystal ingot according to claim 1, wherein the formation of the epitaxial layer is formation of an epitaxial layer having a thickness of 0.5 μm or larger.

4. The method of evaluating a silicon single-crystal ingot according to claim 1, wherein, in a case where a light point defect group in which three or more light point defects are linearly distributed is confirmed in the overlay map, a fact that a proportionality relationship holds between position coordinates of the light point defects and a cut-out position, in an axial direction of the silicon single-crystal ingot, of the plural silicon wafers for which light point defects included in the light point defect group have been confirmed, is further utilized as an estimation criterion for estimating that a region from which the plural silicon wafers, for which light point defects included in the light point defect group have been confirmed, have been cut out is a region in which a twin has occurred.

5. The method of evaluating a silicon single-crystal ingot according to claim 1, wherein a plane orientation of the silicon single-crystal ingot to be evaluated is <100>, and two regions where a {111} plane is present in the silicon single-crystal ingot is further estimated to be a region in which a twin has occurred.

6. The method of evaluating a silicon single-crystal ingot according to claim 1, wherein a plane orientation of the silicon single-crystal ingot to be evaluated is <100>, and in a case where the light point defect group in which three or more light point defects are linearly distributed is confirmed in the overlay map, for at least one of the plural light point defects, either one of two regions at which a {111} plane is present in the silicon single-crystal ingot to be evaluated is further estimated to be a region in which a twin has occurred, on the basis of a shape of a defect observed with an atomic force microscope, the observed defect being present at a position at which the light point defect has been confirmed.

7. A method of evaluating a silicon epitaxial wafer, wherein silicon epitaxial wafers to be evaluated are three or more silicon epitaxial wafers resulting from formation of an epitaxial layer on mirror polished surfaces of silicon mirror polished wafers having been cut out from a same silicon single-crystal ingot and having been processed to a mirror finish, the method comprises:

acquiring light point defect maps of epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers, in a case where a light point defect group in which three or more light point defects are linearly distributed is not confirmed in the overlay map, estimation is made that no twin-induced defect is present in the silicon epitaxial wafers to be evaluated, and in a case where the linearly-distributed light point defect group is confirmed, estimation is made that a twin-induced defect is present in the plural silicon epitaxial wafers for which light point defects included in the light point defect group have been confirmed.

8. The method of evaluating a silicon epitaxial wafer according to claim 7, wherein the linearly-distributed light point defect group is a linearly-distributed light point defect group having a length of 2 mm or larger.

9. The method of evaluating a silicon epitaxial wafer according to claim 7, wherein the epitaxial layer is an epitaxial layer having a thickness of 0.5 μm or larger.

10. The method of evaluating a silicon epitaxial wafer according to claim 7, wherein, in a case where a light point defect group in which three or more light point defects are linearly distributed is confirmed in the overlay map, a fact that a proportionality relationship holds between position coordinates of the light point defects and a cut-out position, in an axial direction of the silicon single-crystal ingot, of the plural silicon wafers for which light point defects included in the light point defect group have been confirmed, is further utilized as an estimation criterion for estimating that a twin-induced defect is present in the plural silicon epitaxial wafers for which light point defects included in the light point defect group have been confirmed.

11. A method of manufacturing a silicon epitaxial wafer, comprising:

cutting out three or more silicon wafers from a same silicon single-crystal ingot;

mirror polishing the plural silicon wafers to yield silicon mirror-surface wafers;

processing the plural silicon mirror polished wafers into silicon epitaxial wafers through formation of an epitaxial layer on the mirror polished surfaces;

evaluating the plural silicon epitaxial wafers by the method of evaluating according to claim 7; and subjecting a silicon epitaxial wafer estimated not to have a twin-induced defect present therein, as a result of the evaluation, to one or more processes for shipping as a product silicon epitaxial wafer.

12. A method of evaluating a silicon mirror polished wafer, wherein silicon mirror polished wafers to be evaluated are silicon mirror polished wafers cut out from a same silicon single-crystal ingot and having been processed to a mirror finish, the method comprises:

processing the plural silicon mirror-surface wafers into silicon epitaxial wafers through formation of an epitaxial layer on the mirror polished surfaces;

acquiring light point defect maps of epitaxial layer surfaces of the plural silicon epitaxial wafers with a laser surface inspection device; and creating an overlay map resulting from overlaying of the light point defect maps acquired for the epitaxial layer surfaces of the plural silicon epitaxial wafers, in a case where a light point defect group in which three or more light point defects are linearly distributed is not confirmed in the overlay map, estimation is made that no twin is present in the silicon mirror polished wafers to be evaluated, and in a case where the linearly-distributed light point defect group is confirmed, estimation is made that a twin is present in a silicon mirror polished wafer included in the plural silicon epitaxial wafers for which light point defects included in the light point defect group have been confirmed.

13. The method of evaluating a silicon mirror polished wafer according to claim 12, wherein the linearly-distributed light point defect group is a linearly-distributed light point defect group having a length of 2 mm or larger.

14. The method of evaluating a silicon mirror polished wafer according to claim 12, wherein the epitaxial layer is an epitaxial layer having a thickness of 0.5 μm or larger.

15. The method of evaluating a silicon mirror polished wafer according claim 12, wherein, in a case where a light point defect group in which three or more light point defects are linearly distributed is confirmed in the overlay map, a fact that a proportionality relationship holds between position coordinates of the light point defects and a cut-out position, in an axial direction of the silicon single-crystal ingot, of the plural silicon epitaxial wafers for which light point defects included in the light point defect group have been confirmed, is further utilized as an estimation criterion for estimating that a twin is present in a silicon mirror polished wafer included in the plural silicon epitaxial wafers for which light point defects included in the light point defect group have been confirmed.

* * * * *